United States Patent
Taniguchi et al.

(10) Patent No.: US 12,149,226 B2
(45) Date of Patent: Nov. 19, 2024

(54) ACOUSTIC WAVE DEVICE, FILTER DEVICE, AND MULTIPLEXER

(71) Applicant: Murata Manufacturing Co., Ltd., Nagaokakyo (JP)

(72) Inventors: Yasumasa Taniguchi, Nagaokakyo (JP); Katsuya Daimon, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 342 days.

(21) Appl. No.: 17/701,971

(22) Filed: Mar. 23, 2022

(65) Prior Publication Data

US 2022/0216850 A1    Jul. 7, 2022

Related U.S. Application Data

(63) Continuation of application No. PCT/JP2020/035314, filed on Sep. 17, 2020.

(30) Foreign Application Priority Data

Sep. 27, 2019  (JP) .................................. 2019-176873

(51) Int. Cl.
*H03H 9/145* (2006.01)
*H03H 9/02* (2006.01)
(Continued)

(52) U.S. Cl.
CPC ...... *H03H 9/1452* (2013.01); *H03H 9/02637* (2013.01); *H03H 9/02866* (2013.01);
(Continued)

(58) Field of Classification Search
CPC ............. H03H 9/1452; H03H 9/02637; H03H 9/02866; H03H 9/02992; H03H 9/25;
(Continued)

(56) References Cited

U.S. PATENT DOCUMENTS 9,985,607 B2 *  5/2018  Link ..................... H04B 15/00
2009/0315640 A1  12/2009  Umeda et al.
(Continued)

FOREIGN PATENT DOCUMENTS

JP    2010010832 A    1/2010
JP    2012231437 A    11/2012
(Continued)

OTHER PUBLICATIONS

Official Communication issued in International Patent Application No. PCT/JP2020/035314, mailed on Nov. 10, 2020.
Office Action in JP2021-548865, mailed Jul. 25, 2023, 4 pages.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a piezoelectric substrate, a first interdigital transducer (IDT) electrode, reflectors on both sides of the first IDT electrode in a propagation direction of an acoustic wave, and a second IDT electrode facing the first IDT electrode with a reflector interposed therebetween. The first and second IDT electrodes include first and second intersecting areas in which electrode fingers overlap in the propagation direction. The first and second intersecting areas overlap in the propagation direction. A third busbar of the second IDT electrode is coupled to a first busbar of the first IDT electrode. A fourth busbar of the second IDT electrode is coupled to a ground potential. A resonant frequency of the second IDT electrode is in a frequency band of an interference wave signal.

20 Claims, 9 Drawing Sheets

(51) Int. Cl.
*H03H 9/25* (2006.01)
*H03H 9/64* (2006.01)
*H03H 9/72* (2006.01)

(52) U.S. Cl.
CPC .......... *H03H 9/02992* (2013.01); *H03H 9/25* (2013.01); *H03H 9/6483* (2013.01); *H03H 9/725* (2013.01)

(58) Field of Classification Search
CPC .... H03H 9/6483; H03H 9/725; H03H 9/0274; H03H 9/02574; H03H 9/14544; H03H 9/6426; H03H 9/145; H03H 9/64; H03H 9/72; H03H 9/14541; H03H 9/643
USPC .......................................... 333/133, 193–196
See application file for complete search history.

(56) References Cited

U.S. PATENT DOCUMENTS

| | | |
|---|---|---|
| 2012/0274416 A1 | 11/2012 | Hara et al. |
| 2014/0009247 A1 | 1/2014 | Moriya |
| 2014/0218128 A1 | 8/2014 | Fujita |
| 2016/0126932 A1 | 5/2016 | Nakai et al. |
| 2019/0181836 A1 | 6/2019 | Nakai et al. |
| 2020/0403603 A1 | 12/2020 | Daimon et al. |

FOREIGN PATENT DOCUMENTS

| | | |
|---|---|---|
| JP | 2014-013959 A | 1/2014 |
| JP | 2019-106622 A | 6/2019 |
| WO | 2013/061694 A1 | 5/2013 |
| WO | 2014/196245 A1 | 12/2014 |
| WO | 2019/177028 A1 | 9/2019 |

* cited by examiner

ACOUSTIC WAVE DEVICE, FILTER DEVICE, AND MULTIPLEXER

CROSS REFERENCE TO RELATED APPLICATIONS

This application claims the benefit of priority to Japanese Patent Application No. 2019-176873 filed on Sep. 27, 2019 and is a Continuation Application of PCT Application No. PCT/JP2020/035314 filed on Sep. 17, 2020. The entire contents of each application are hereby incorporated herein by reference.

BACKGROUND OF THE INVENTION

1. Field of the Invention

The present invention relates to an acoustic wave device, a filter device, and a multiplexer.

2. Description of the Related Art

Acoustic wave devices have provided a wide range of applications such as filters of mobile phones. Japanese Unexamined Patent Application Publication No. 2019-106622 describes an example of a multiplexer including filters having acoustic wave resonators. The acoustic wave resonator is formed by disposing an interdigital transducer (IDT) electrode on a piezoelectric substrate. On the substrate, a pair of reflectors are disposed on both sides with respect to the IDT electrode in the propagation direction of acoustic wave. A plurality of filter devices are coupled to a common terminal by common connection. The common terminal is coupled to an antenna.

When such an acoustic wave resonator is used in filters of a multiplexer, concern arises about degradation of the receive sensitivity of the multiplexer in the case in which the pass band of filter devices included in the multiplexer is a particular band. More specifically, when the multiplexer, which includes a transmit filter and a receive filter, outputs a transmit signal from the transmit filter to an antenna, another signal may be inputted from the antenna. At this time, if the communication band of the transmit filter and receive filter is, for example, Band 25, the inputted signal may act as an interference wave signal. As a result, intermodulation distortion (IMD) may occur in the receive band of Band 25, resulting in degradation of the receive sensitivity.

SUMMARY OF THE INVENTION

Preferred embodiments of the present invention provide acoustic wave devices, filter devices, and multiplexers that are each able to reduce IMD and reduce or prevent degradation of the receive sensitivity.

An acoustic wave device according to a preferred embodiment of the present invention includes a piezoelectric substrate including a piezoelectric layer, a first interdigital transducer (IDT) electrode on the piezoelectric substrate, a pair of reflectors on both sides of the first IDT electrode in a propagation direction of an acoustic wave on the piezoelectric substrate, and a second IDT electrode on the piezoelectric substrate and facing the first IDT electrode with one reflector of the pair of reflectors interposed therebetween. The first IDT electrode and the second IDT electrode each include a pair of busbars and a plurality of electrode fingers, some electrode fingers of the plurality of electrode fingers are coupled to one busbar of the pair of busbars in each of the first IDT electrode and the second IDT electrode, and other electrode fingers of the plurality of electrode fingers are coupled to another busbar of the pair of busbars in each of the first IDT electrode and the second IDT electrode. The first IDT electrode and the second IDT electrode each include an intersecting area in which the plurality of electrode fingers overlap in the propagation direction of acoustic wave, and at least a portion of the intersecting area of the first IDT electrode and at least a portion of the intersecting area of the second IDT electrode overlap in the propagation direction of acoustic wave. One busbar of the pair of busbars of the second IDT electrode is coupled to one busbar of the pair of busbars of the first IDT electrode, and another busbar of the pair of busbars of the second IDT electrode is coupled to a ground potential. A resonant frequency of the second IDT electrode is in a frequency band of an interference wave signal.

A filter device according to a preferred embodiment of the present invention is configured to be coupled to an antenna. The filter device includes a series arm resonator and a parallel arm resonator. At least one of the series arm resonator and the parallel arm resonator is an acoustic wave device according to a preferred embodiment of the present invention.

A multiplexer according to a preferred embodiment of the present invention includes an antenna terminal to be coupled to an antenna, and a plurality of filter devices coupled to the antenna terminal by a common connection. At least one of the filter devices is a filter device according to a preferred embodiment of the present invention.

The acoustic wave devices, the filter devices, and the multiplexers according to preferred embodiments of the present invention are each able to reduce intermodulation distortion (IMD) and reduce or prevent degradation of the receive sensitivity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention will be clarified by describing preferred embodiments of the present invention with reference to the drawings.

The preferred embodiments described in this specification are merely examples, and configurations of different preferred embodiments may be partially replaced or combined.

Figure 1:
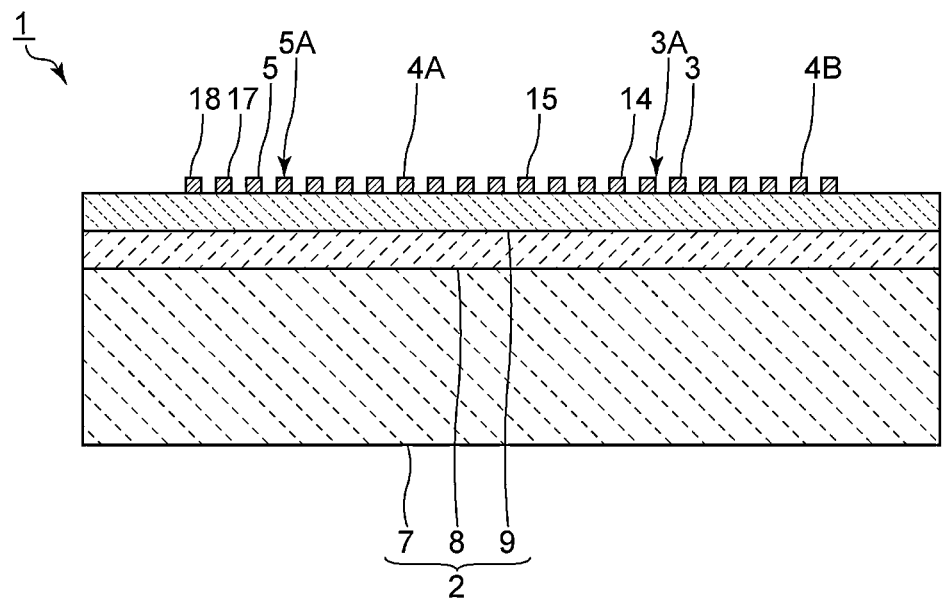
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention.

The acoustic wave device 1 includes a piezoelectric substrate 2. A first interdigital transducer (IDT) electrode 3 is disposed on the piezoelectric substrate 2. The piezoelectric substrate 2 and the first IDT electrode 3 define a first IDT 3A. When alternating-current voltage is applied to an IDT electrode, acoustic waves are produced. A pair of reflectors 4A and 4B are disposed on both sides of the first IDT electrode 3 in the propagation direction of acoustic wave on the piezoelectric substrate 2. Additionally, a second IDT electrode 5 is disposed on the piezoelectric substrate 2 and facing the first IDT electrode 3 with the reflector 4A interposed therebetween. The piezoelectric substrate 2 and the second IDT electrode 5 define a second IDT 5A. As such, the acoustic wave device 1 includes the first IDT 3A, which is defined by the first IDT electrode 3, and the second IDT 5A, which is defined by the second IDT electrode 5. The acoustic wave device 1 also includes the reflectors 4A and 4B. The acoustic wave device 1 according to the present preferred embodiment is an acoustic wave resonator.

Figure 2:
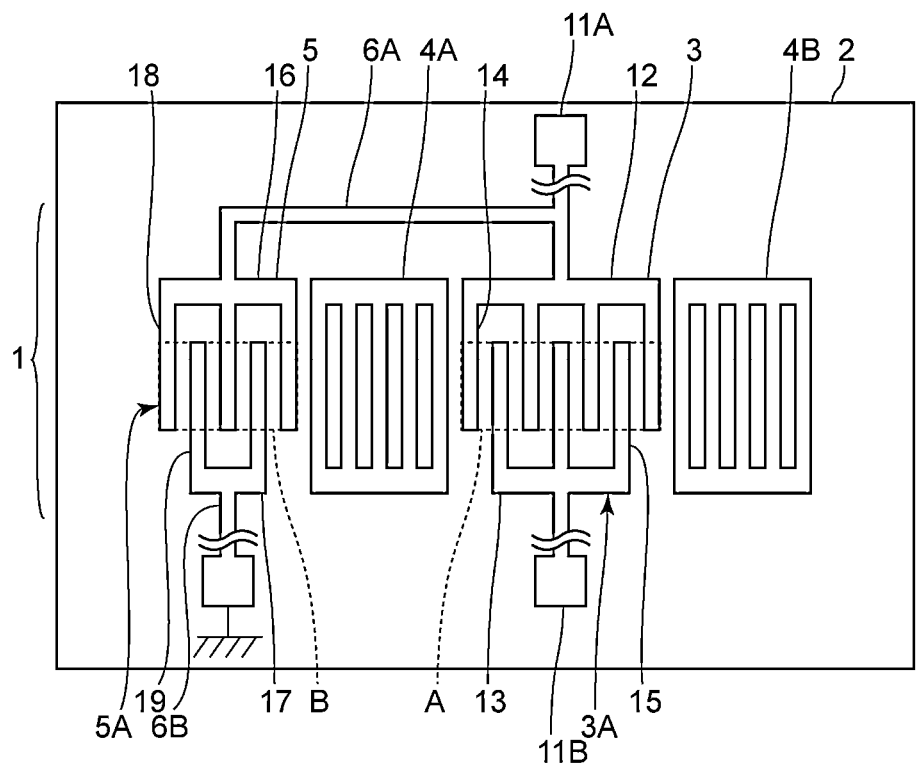
FIG. 2 is a schematic plan view illustrating an electrode structure of the acoustic wave device according to the first preferred embodiment of the present invention.

FIG. 2 is a schematic plan view illustrating an electrode structure of the acoustic wave device according to the first preferred embodiment.

The first IDT electrode 3 includes a first busbar 12 and a second busbar 13 in a pair. The first busbar 12 and the second busbar 13 face each other. The first IDT electrode 3 includes a plurality of first electrode fingers 14 and a plurality of second electrode fingers 15. The first electrode fingers 14 include some of the plurality of electrode fingers included in the first IDT electrode 3, and the second electrode fingers 15 include others of the plurality of electrode fingers included in the first IDT electrode 3. One end of each of the first electrode fingers 14 is connected to the first busbar 12. One end of each of the second electrode fingers 15 is connected to the second busbar 13. The first electrode fingers 14 and the second electrode fingers 15 are interdigitated with each other. The first IDT electrode 3 includes a first intersecting area A. In the first intersecting area A, the first electrode fingers 14 and the second electrode fingers 15 overlap in the propagation direction of acoustic wave.

At least one of the first busbar 12 and the second busbar 13 is coupled to a signal potential. More specifically, when the acoustic wave device 1 is used as, for example, a series arm resonator of a filter such as a ladder filter, the first busbar 12 and the second busbar 13 are both coupled to the signal potential. When the acoustic wave device 1 is used as, for example, a parallel arm resonator of a filter such as a ladder filter, one of the first busbar 12 and the second busbar 13 is coupled to the signal potential, while the other is coupled to the ground potential.

In the present preferred embodiment, the acoustic wave device 1 is coupled to an antenna. The first busbar 12 is positioned closer to the antenna than the second busbar 13. In this specification, being positioned closer to an antenna than another busbar or element denotes being connected electrically closer to the antenna than the other busbar or element.

The first IDT electrode 3 is coupled to an antenna via an antenna terminal 11A. More specifically, the first busbar 12 is coupled to the antenna terminal 11A. The first busbar 12 may be coupled directly or indirectly via, for example, another element to the antenna terminal 11A. The second busbar 13 is positioned closer to a signal terminal 11B side different from the antenna terminal 11A than the first busbar 12. The signal terminal 11B is coupled to the signal potential. The second busbar 13 may be coupled directly or indirectly via, for example, another element to the signal terminal 11B.

The second IDT electrode 5 includes a third busbar 16 and a fourth busbar 17 in a pair. The third busbar 16 and the fourth busbar 17 face each other. The second IDT electrode 5 includes a plurality of third electrode fingers 18 and a plurality of fourth electrode fingers 19. The third electrode fingers 18 include some of the plurality of electrode fingers included in the second IDT electrode 5, and the fourth electrode fingers 19 include others of the plurality of electrode fingers included in the second IDT electrode 5. One end of each of the third electrode fingers 18 is connected to the third busbar 16. One end of each of the fourth electrode fingers 19 is connected to the fourth busbar 17. The third electrode fingers 18 and the fourth electrode fingers 19 are interdigitated with each other. The second IDT electrode 5 includes a second intersecting area B. In the second intersecting area B, the third electrode fingers 18 and the fourth electrode fingers 19 overlap in the propagation direction of acoustic wave.

As illustrated in FIG. 2, the first intersecting area A of the first IDT electrode 3 and the second intersecting area B of the second IDT electrode 5 overlap in the propagation direction of acoustic wave. More specifically, given that the direction perpendicular or substantially perpendicular to the propagation direction of acoustic wave is an overlap-width direction, with respect to the propagation direction of acoustic wave, a middle portion of the first intersecting area A in the overlap-width direction overlaps a middle portion of the second intersecting area B in the overlap-width direction. It is only necessary that at least a portion of the first intersecting area A and at least a portion of the second intersecting area B overlap in the propagation direction of acoustic wave.

The third busbar 16 is coupled to the signal potential. The third busbar 16 is connected to the first busbar 12 of the first IDT electrode 3. More specifically, a hot wire 6A connects the third busbar 16 to the first busbar 12. The first busbar 12 and the third busbar 16 are coupled to the signal potential via the hot wire 6A.

The fourth busbar 17 of the second IDT electrode 5 is coupled to the ground potential. More specifically, the fourth busbar 17 is coupled to the ground potential via a ground wire 6B. It is only necessary that the wiring is configured such that one of the third busbar 16 and the fourth busbar 17 is coupled to the signal potential, and the other is coupled to the ground potential.

In the present preferred embodiment, the resonant frequency of the first IDT 3A of the acoustic wave device 1 is, for example, in the range of about 1850 MHz to about 1915 MHz, which is the transmit band of Band 25. The resonant frequency of the second IDT 5A of the acoustic wave device 1 is, for example, in a frequency band of interference wave signals. More specifically, the resonant frequency of the second IDT 5A of the acoustic wave device 1 is, for example, in the range of about 1770 MHz to about 1835 MHz, which is the interference-wave frequency band of Band 25. In this specification, the interference wave signal indicates a signal of a frequency given by 2Tx−Rx, where Tx is a frequency of the transmit band, and Rx is a frequency of the receive band.

Of the acoustic wave device 1, the resonant frequency of the first IDT 3A and the resonant frequency of the second IDT 5A are not limited to the examples described above.

Referring back to FIG. 1, the piezoelectric substrate 2 is a multilayer substrate including a high acoustic velocity support substrate 7 defining and functioning as a high acoustic velocity material layer, a low acoustic velocity film 8, and a piezoelectric layer 9 stacked in this order. The piezoelectric substrate 2 may include only the piezoelectric layer 9.

The piezoelectric layer 9 is, for example, a lithium tantalate layer. The material of the piezoelectric layer 9 is not limited to the above example. For example, lithium niobate, zinc oxide, aluminum nitride, quartz-crystal, or PZT may also be used as the material of the piezoelectric layer 9.

The low acoustic velocity film 8 is, a film with a relatively low acoustic velocity. More specifically, the acoustic velocity of bulk waves propagating in the low acoustic velocity film 8 is lower than the acoustic velocity of bulk waves propagating in the piezoelectric layer 9. The low acoustic velocity film 8 is, for example, a silicon oxide film. Silicon oxide can be indicated by $SiO_x$. In the present preferred embodiment, the low acoustic velocity film 8 is, for example, a $SiO_2$ film. The material of the low acoustic velocity film 8 is not limited to the above example. For example, glass, silicon oxynitride, tantalum oxide, or a material containing as a principal component a compound formed by adding fluorine, carbon, or boron to silicon oxide may also be used as the material of the low acoustic velocity film 8.

The high acoustic velocity material layer is a layer with a relatively high acoustic velocity. More specifically, the acoustic velocity of bulk waves propagating in the high acoustic velocity material layer is higher than the acoustic velocity of bulk waves propagating in the piezoelectric layer 9. The high acoustic velocity support substrate 7 defining and functioning as the high acoustic velocity material layer is, for example, a silicon substrate. The material of the high acoustic velocity support substrate 7 is not limited to the above example. For example, a medium containing as a principal component a material such as aluminum oxide, silicon carbide, silicon nitride, silicon oxynitride, sapphire, lithium tantalate, lithium niobate, quartz-crystal, alumina, zirconia, cordierite, mullite, steatite, forsterite, magnesia, diamond-like carbon (DLC) film, or diamond may be used as the material of the high acoustic velocity support substrate 7.

Because the piezoelectric substrate 2 has a layered structure including the high acoustic velocity support substrate 7, the low acoustic velocity film 8, and the piezoelectric layer 9, acoustic waves can be effectively confined in the piezoelectric layer 9 side.

As illustrated in FIG. 2, in the present preferred embodiment, the acoustic wave device 1 has the following structure: 1) the acoustic wave device 1 includes the second IDT electrode 5, and the second IDT electrode 5 and the first IDT electrode 3 face each other with the reflector 4A interposed therebetween; 2) at least a portion of the first intersecting area A and at least a portion of the second intersecting area B overlap in the propagation direction of acoustic wave; 3) the third busbar 16 of the second IDT electrode 5 is connected to the first busbar 12 of the first IDT electrode 3, and the fourth busbar 17 of the second IDT electrode 5 is coupled to the ground potential. With this structure, waves at frequencies close to interference-wave frequencies are caused at the second IDT electrode 5, and as a result, it is possible to reduce or prevent the occurrence of intermodulation distortion (IMD) due to inputs of interference wave signals. Accordingly, when the acoustic wave device 1 is used in a filter device of, for example, a multiplexer, it is possible to reduce or prevent degradation of the receive sensitivity of another filter device coupled to a signal potential by common connection with the filter device. This will be further described in detail below by comparing the present preferred embodiment to a first comparative example and a second comparative example.

Figure 3:
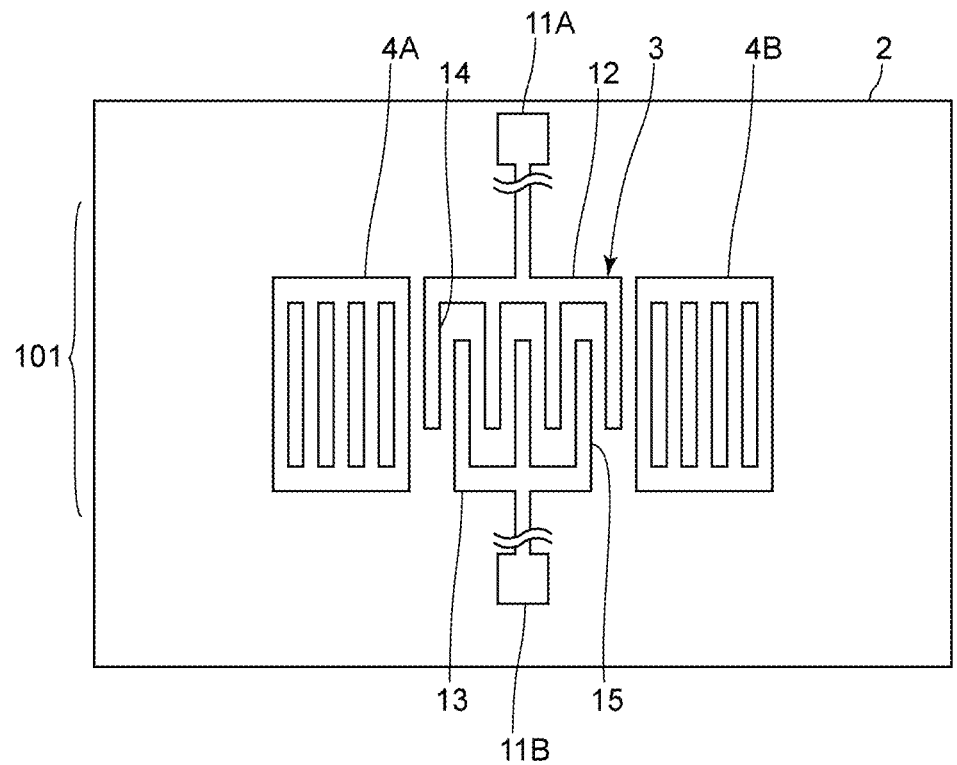
FIG. 3 is a schematic plan view illustrating an electrode structure of an acoustic wave device according to a first comparative example.

The acoustic wave device 1 having the structure of the first preferred embodiment and an acoustic wave device 101 of the first comparative example illustrated in FIG. 3 were prepared. The first comparative example differs from the first preferred embodiment in that it does not include the second IDT electrode 5. The design parameters of the acoustic wave device 1 are described below. The design parameters of the prepared acoustic wave device 101 are the same or substantially the same as the design parameters of the acoustic wave device 1, except that the acoustic wave device 101 does not include the second IDT electrode 5.

The first IDT electrode 3: number of pairs of electrode fingers 99 pairs, wavelength about 2.104 μm, duty ratio about 0.5

The second IDT electrode 5: number of pairs of electrode fingers 10 pairs, wavelength about 2.104 μm, duty ratio about 0.5

The reflectors 4A and 4B: number of electrode fingers 21 fingers, wavelength about 2.104 μm The resonant frequency of the first IDT 3A of the acoustic wave device 1 and the resonant frequency of the acoustic wave device 101 are in the transmit band of Band 25. When a signal in the transmit band of Band 25 and an interference wave signal are inputted at the same time to such acoustic wave resonators, the third-order IMD occurs in the range of about 1930 MHz to about 1995 MHz, which is the receive band of Band 25. The measurement of the level of third-order intermodulation distortion (IMD3) was conducted in the condition in which a signal in the transmit band and an interference wave signal were inputted at the same time to the acoustic wave device 1 and the acoustic wave device 101.

Figure 4:
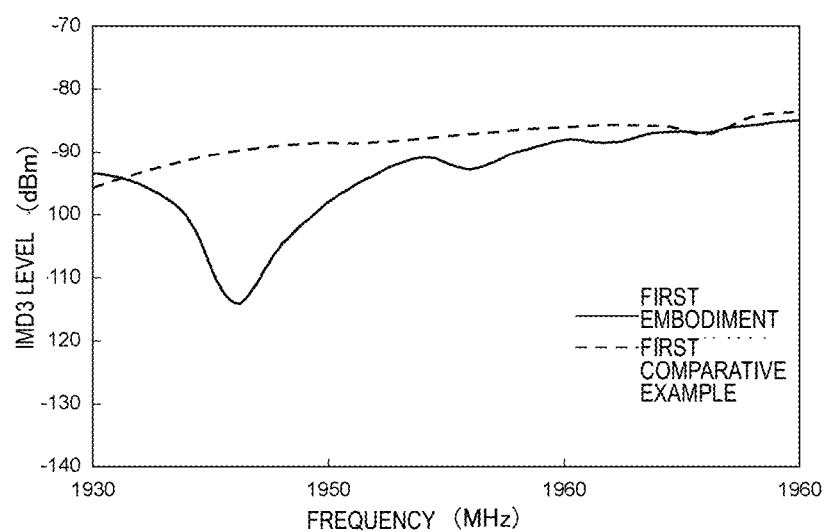
FIG. 4 illustrates the level of third-order intermodulation distortion (IMD3) with respect to the acoustic wave device according to the first preferred embodiment of the present invention and the acoustic wave device according to the first comparative example.

FIG. 4 illustrates the level of IMD3 with respect to the acoustic wave device according to the first preferred embodiment and the acoustic wave device according to the first comparative example.

As illustrated in FIG. 4, the level of IMD3 in the acoustic wave device 1 having the structure of the first preferred embodiment is lower than the level of IMD3 in the acoustic wave device 101 of the first comparative example. As for the first preferred embodiment, the level of IMD3 is particularly low at frequencies close to 1936 MHz. At the frequencies close to 1936 MHz, the level of IMD3 of the first preferred embodiment is better by approximately 24 dB than the level of IMD3 of the first comparative example.

When a signal in the transmit band and an interference wave signal are inputted at the same to the acoustic wave device 101 of the first comparative example, a wave of a frequency close to the interference-wave frequency is caused at the first IDT electrode 3 in addition to a wave based on the signal in the transmit band. This results in IMD.

In contrast, the acoustic wave device 1 according to the first preferred embodiment includes the second IDT electrode 5 in addition to the first IDT electrode 3. Further, the fourth busbar 17 of the second IDT electrode 5 is coupled to the ground potential. As a result, when a signal in the transmit band and an interference wave signal are inputted at the same time to the acoustic wave device 1, a wave of a frequency close to the interference-wave frequency is caused in not only the first IDT electrode 3 but also the second IDT electrode 5. Furthermore, the second IDT electrode 5 is disposed facing the first IDT electrode 3 with the reflector 4A interposed therebetween, and the first intersecting area A and the second intersecting area B overlap in the propagation direction of acoustic wave. As a result, the IMD signal caused in the first IDT electrode 3 and the IMD signal caused in the second IDT electrode 5 interfere with each other to cancel each other out. As such, IMD can be reduced. Accordingly, when the acoustic wave device 1 is used in a filter device of, for example, a multiplexer, it is possible to reduce or prevent degradation of the receive sensitivity of another filter device coupled to a signal potential by common connection with the filter device.

Figure 5:
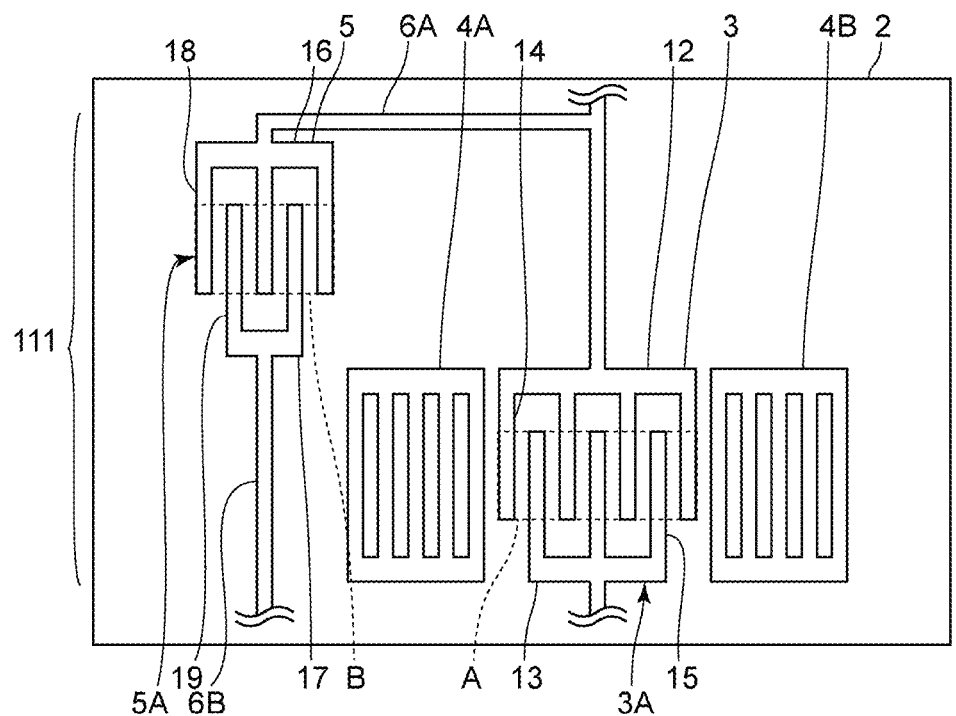
FIG. 5 is a schematic plan view illustrating an electrode structure of an acoustic wave device according to a second comparative example.

An acoustic wave device 111 according to the second comparative example illustrated in FIG. 5 was prepared. In FIG. 5, the terminals are not illustrated. The second comparative example differs from the first preferred embodiment in that the first IDT electrode 3 and the second IDT electrode 5 are spaced apart from each other in the overlap-width direction, and the entire first intersecting area A and the second intersecting area B do not overlap in the propagation direction of acoustic wave. The design parameters of the prepared acoustic wave device 111 are the same or substantially the same as the design parameters of the acoustic wave device 1.

Figure 6:
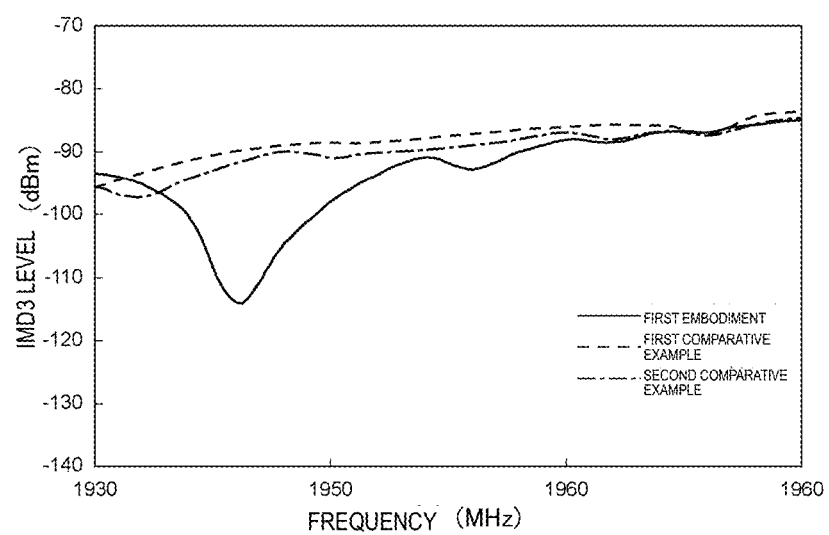
FIG. 6 illustrates the level of IMD3 with respect to the acoustic wave device according to the first preferred embodiment of the present invention, the acoustic wave device according to the first comparative example, and the acoustic wave device according to the second comparative example.

FIG. 6 illustrates the level of IMD3 with respect to the acoustic wave device according to the first preferred embodiment, the acoustic wave device according to the first comparative example, and the acoustic wave device according to the second comparative example.

As illustrated in FIG. 6, the level of IMD3 in the acoustic wave device 1 having the structure of the first preferred embodiment is lower than the level of IMD3 in the acoustic wave device 111 of the second comparative example. It can be understood that the first preferred embodiment can reduce IMD because the first intersecting area A overlaps the second intersecting area B in the propagation direction of acoustic wave.

When a filter device includes an element especially for hindering the input of interference wave, the design flexibility of the filter device may be degraded under the influence of the element on impedance. Moreover, the insertion loss may be increased. In this respect, when the acoustic wave device 1 is used in a filter device, it is possible to reduce IMD with the structure of the acoustic wave device 1 defining and functioning as an acoustic wave resonator. There is, thus, no need for an element especially for hindering the input of interference wave. Accordingly, it is possible to reduce IMD without degradation of the design flexibility and increases in the insertion loss.

The measurement of the level of IMD3 was conducted in the condition in which the second IDT electrode 5 of the acoustic wave device 1 according to the first preferred embodiment was varied with respect to the number of pairs of electrode fingers. The number of pairs of electrode fingers varied among five, ten, and twenty pairs. The level of IMD3 of the first comparative example, in which the second IDT electrode 5 is not included, and the number of pairs of electrode fingers of the second IDT electrode 5 is thus considered as zero, is also illustrated.

Figure 7:
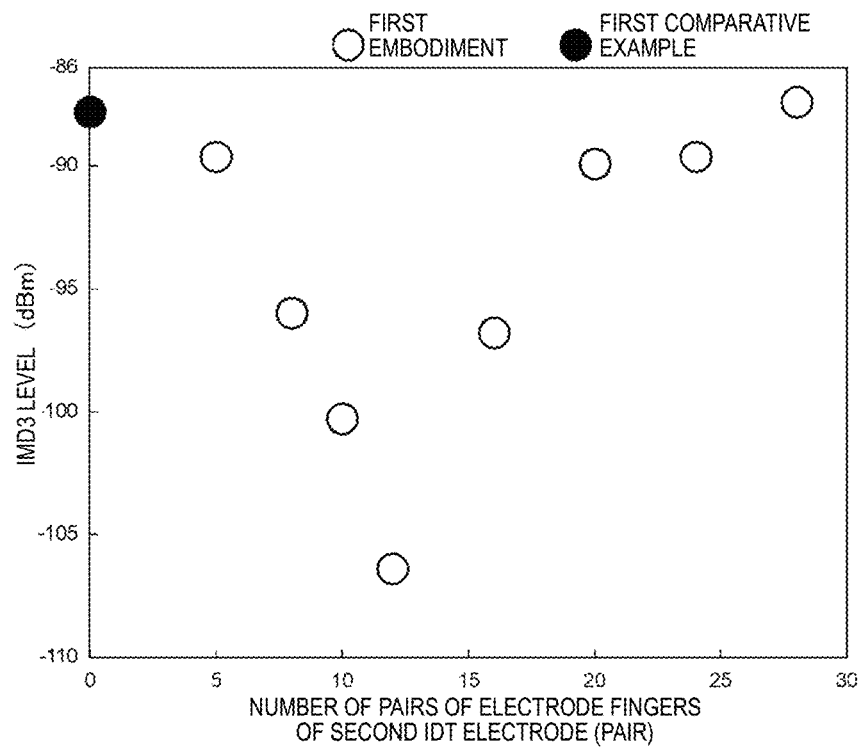
FIG. 7 illustrates the relationship between the number of pairs of electrode fingers of a second IDT electrode and the level of IMD3 with respect to the first preferred embodiment and the first comparative example.

FIG. 7 illustrates the relationship between the number of pairs of electrode fingers of the second IDT electrode and the level of IMD3 with respect to the first preferred embodiment and the first comparative example.

As illustrated in FIG. 7, regardless of the variations in the number of pairs of electrode fingers of the second IDT electrode 5 of the first preferred embodiment, IMD in the first preferred embodiment is lower than the first comparative example. In the first preferred embodiment, when the number of pairs of electrode fingers of the second IDT electrode 5 is ten or less, as the number of pairs of electrode fingers increases, IMD decreases. It is preferable that the number of pairs of electrode fingers of the second IDT electrode 5 is in the range of five to twenty, for example. As such, IMD can be further reduced.

As described above, in the piezoelectric substrate 2 of the first preferred embodiment, the piezoelectric layer 9 is disposed over the high acoustic velocity support substrate 7 with the low acoustic velocity film 8 interposed therebetween, without direct contact with the high acoustic velocity support substrate 7. The structure of the piezoelectric substrate 2 is, however, not limited to the example described above. The following describes first to third modifications of the first preferred embodiment. The first to third modifications differ from the first preferred embodiment only in the structure of the piezoelectric substrate. The first to third modifications can also reduce IMD similarly to the first preferred embodiment. Additionally, the first to third modifications can effectively confine the energy of acoustic wave in the piezoelectric layer 9 side.

Figure 8:
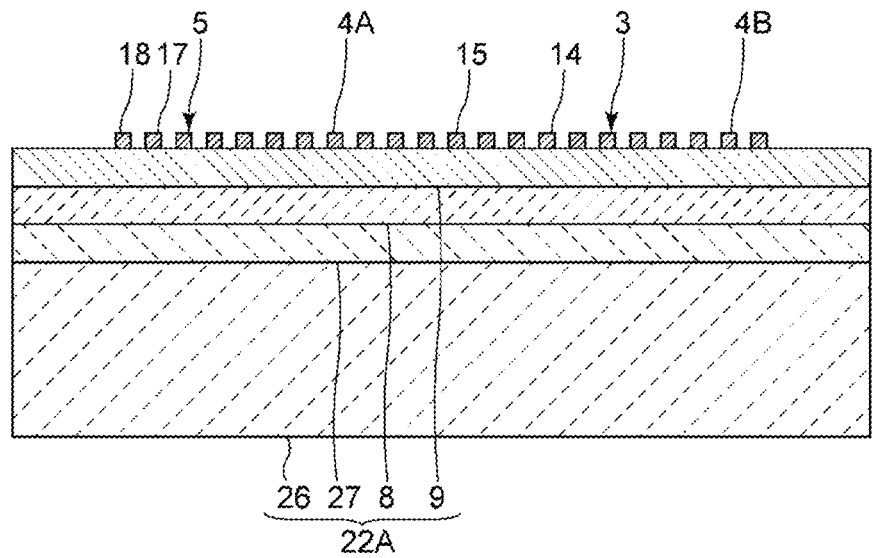
FIG. 8 is an elevational cross-sectional view of an acoustic wave device according to a first modification of the first preferred embodiment of the present invention.

In the first modification illustrated in FIG. 8, the high acoustic velocity material layer is a high acoustic velocity film 27. A piezoelectric substrate 22A includes a support substrate 26, the high acoustic velocity film 27, the low acoustic velocity film 8, and the piezoelectric layer 9. The high acoustic velocity film 27 is disposed on the support substrate 26. The low acoustic velocity film 8 is disposed on the high acoustic velocity film 27. The piezoelectric layer 9 is disposed on the low acoustic velocity film 8. When the piezoelectric substrate 22A includes the high acoustic velocity film 27, it is unnecessary to use a relatively high acoustic velocity material for the support substrate 26.

Examples of the material of the support substrate 26 include, for example, piezoelectric materials such as aluminum oxide, lithium tantalate, lithium niobate, and quartz-crystal, ceramics such as alumina, magnesia, silicon nitride, aluminum nitride, silicon carbide, zirconia, cordierite, mullite, steatite, and forsterite, dielectric materials such as sapphire, diamond, and glass, and semiconductors or resins such as silicon and gallium nitride.

As the material of the high acoustic velocity film 27, for example, a medium including as a principal component a material such as aluminum oxide, silicon carbide, silicon nitride, silicon oxynitride, silicon, sapphire, lithium tantalate, lithium niobate, quartz-crystal, alumina, zirconia, cordierite, mullite, steatite, forsterite, magnesia, DLC film, or diamond may be used.

Figure 9:
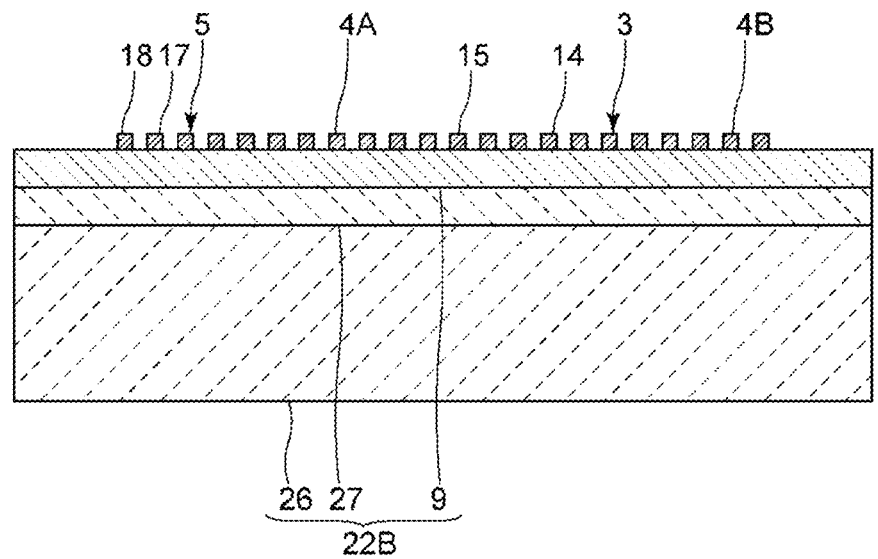
FIG. 9 is an elevational cross-sectional view of an acoustic wave device according to a second modification of the first preferred embodiment of the present invention.

In the second modification illustrated in FIG. 9, a piezoelectric substrate 22B includes the support substrate 26, the high acoustic velocity film 27, and the piezoelectric layer 9. In this modification, the piezoelectric layer 9 is disposed on the high acoustic velocity film 27 defining and functioning as a high acoustic velocity material layer with direct contact with the high acoustic velocity film 27.

Figure 10:
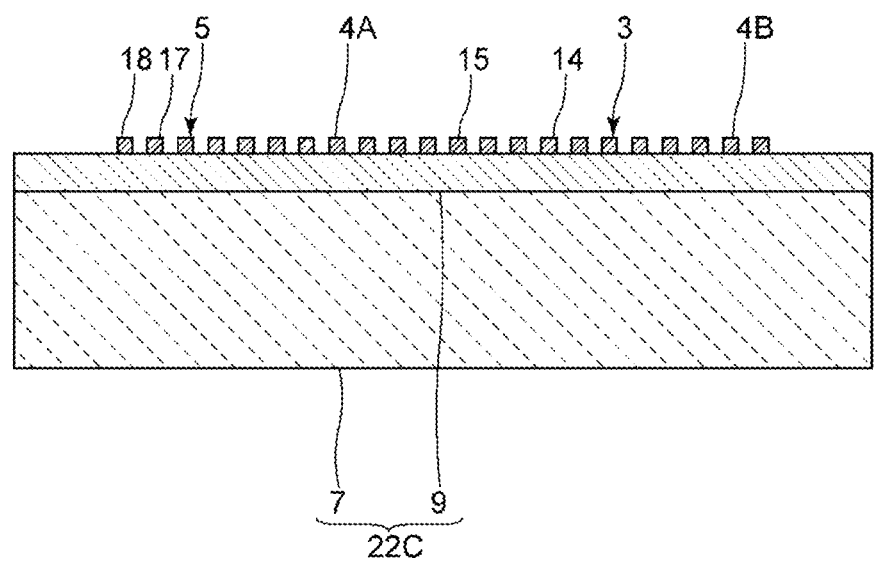
FIG. 10 is an elevational cross-sectional view of an acoustic wave device according to a third modification of the first preferred embodiment of the present invention.

In the third modification illustrated in FIG. 10, a piezoelectric substrate 22C includes the high acoustic velocity support substrate 7 and the piezoelectric layer 9. In this modification, the piezoelectric layer 9 is disposed on the high acoustic velocity support substrate 7 defining and functioning as a high acoustic velocity material layer with direct contact with the high acoustic velocity support substrate 7.

Figure 11:
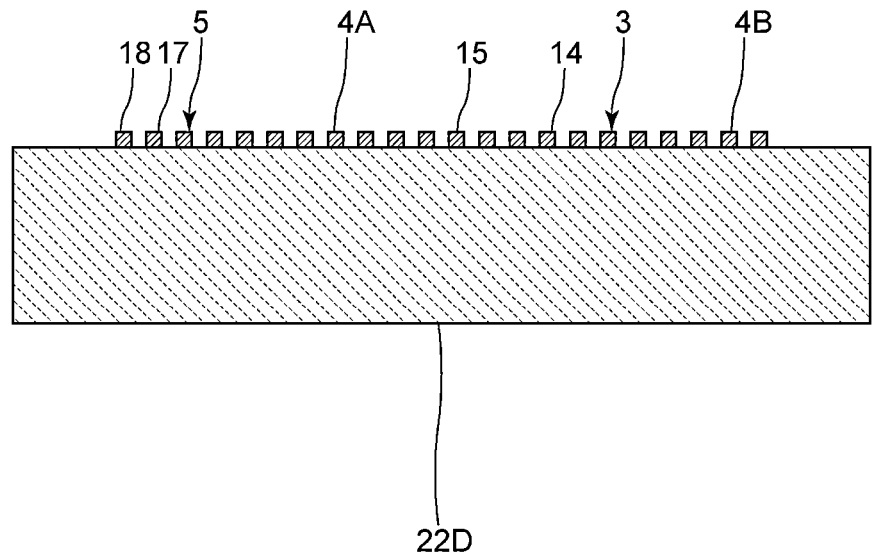
FIG. 11 is an elevational cross-sectional view of an acoustic wave device according to a fourth modification of the first preferred embodiment of the present invention.

In contrast, in a fourth modification of the first preferred embodiment illustrated in FIG. 11, a piezoelectric substrate 22D includes only a piezoelectric layer. Also in this case, it is possible to reduce IMD similarly to the first preferred embodiment.

Figure 12:
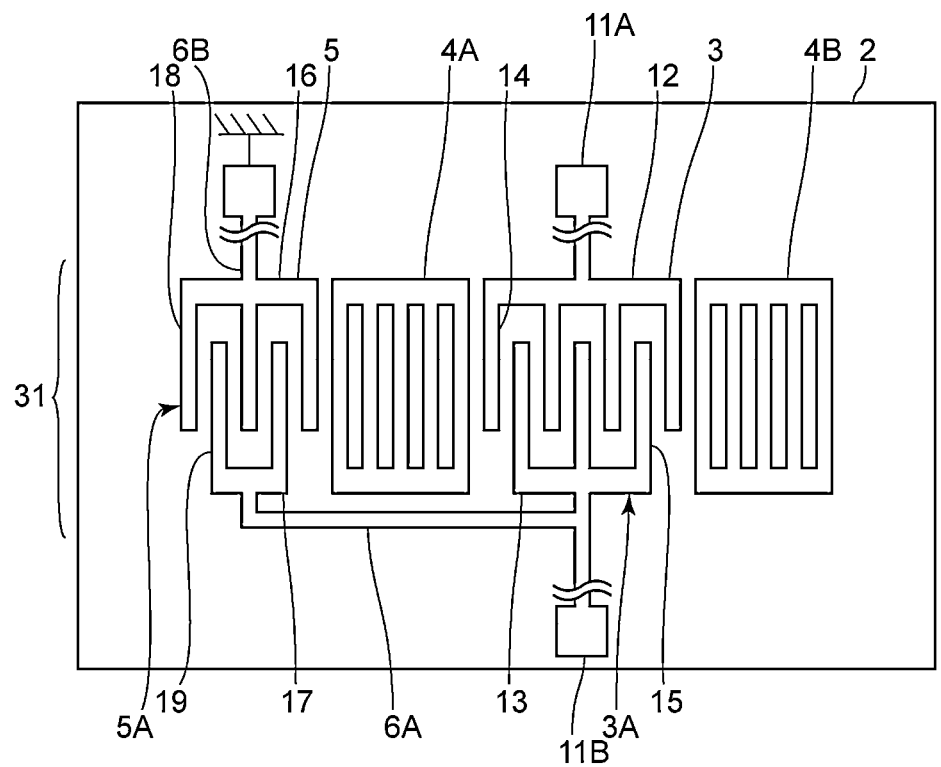
FIG. 12 is a schematic plan view illustrating an electrode structure of an acoustic wave device according to a second preferred embodiment of the present invention.

FIG. 12 is a schematic plan view illustrating an electrode structure of an acoustic wave device according to a second preferred embodiment of the present invention.

The present preferred embodiment differs from the first preferred embodiment in that the fourth busbar 17 of the second IDT electrode 5 is connected to the second busbar 13 of the first IDT electrode 3, and the third busbar 16 of the second IDT electrode 5 is coupled to the ground potential. More specifically, the hot wire 6A connects the fourth busbar 17 of the second IDT electrode 5 to the second busbar 13 of the first IDT electrode 3. The third busbar 16 is coupled to the ground potential via the ground wire 6B. Apart from the points described above, an acoustic wave device 31 according to the present preferred embodiment is the same or substantially the same as the acoustic wave device 1 according to the first preferred embodiment.

The second busbar 13 of the first IDT electrode 3 is positioned closer to the signal terminal 11B side different from the antenna terminal 11A than the first busbar 12. The present preferred embodiment can also reduce IMD similarly to the first preferred embodiment. This will be further described in detail below by comparing the present preferred embodiment to the first comparative example and a third comparative example.

The first comparative example does not include the second IDT electrode similarly to the comparative example compared to the first preferred embodiment. The third comparative example differs from the second preferred embodiment in that the first IDT electrode and the second IDT electrode are spaced apart from each other in the overlap-width direction, and the first intersecting area and the second intersecting area do not overlap in the propagation direction of acoustic wave.

The acoustic wave device 31 having the structure of the second preferred embodiment, the acoustic wave device according to the first comparative example, and the acoustic wave device according to the third comparative example were prepared. The design parameters of the prepared acoustic wave device 31 having the structure of the second preferred embodiment and the design parameters of the acoustic wave device according to the third comparative example are described below. It should be noted that the design parameters of the prepared acoustic wave device 101 of the first comparative example are the same as the design parameters of the acoustic wave device 31 except that the acoustic wave device 101 does not include the second IDT electrode 5.

The first IDT electrode 3: number of pairs of electrode fingers 99 pairs, wavelength about 2.104 μm, duty ratio about 0.5

The second IDT electrode 5: number of pairs of electrode fingers 10 pairs, wavelength about 2.104 μm, duty ratio about 0.5

The reflectors 4A and 4B: number of electrode fingers 21 fingers, wavelength about 2.104 μm The measurement of the level of IMD3 was conducted in the condition in which a signal in the transmit band of Band 25 and an interference wave signal were inputted at the same time to the acoustic wave devices presented above.

Figure 13:
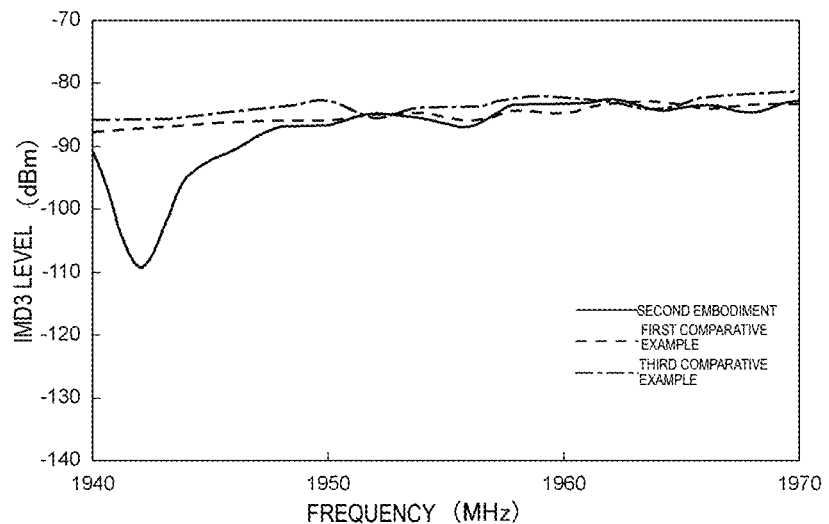
FIG. 13 illustrates the level of IMD3 with respect to the acoustic wave device according to the second preferred embodiment of the present invention, the acoustic wave device according to the first comparative example, and an acoustic wave device according to a third comparative example.

FIG. 13 illustrates the level of IMD3 with respect to the acoustic wave device according to the second preferred embodiment, the acoustic wave device according to the first comparative example, and the acoustic wave device according to the third comparative example.

As illustrated in FIG. 13, the level of IMD3 in the acoustic wave device 31 having the structure of the second preferred embodiment is lower than the level of IMD3 in the acoustic wave device 101 according to the first comparative example and the level of IMD3 in the acoustic wave device according to the third comparative example. As for the second preferred embodiment, the level of IMD3 is particularly low at frequencies close to 1942 MHz. At the frequencies close to 1942 MHz, the level of IMD3 of the second preferred embodiment is better by approximately 22 dB than the level of IMD3 of the first comparative example. As such, the second preferred embodiment can reduce IMD.

Figure 14:
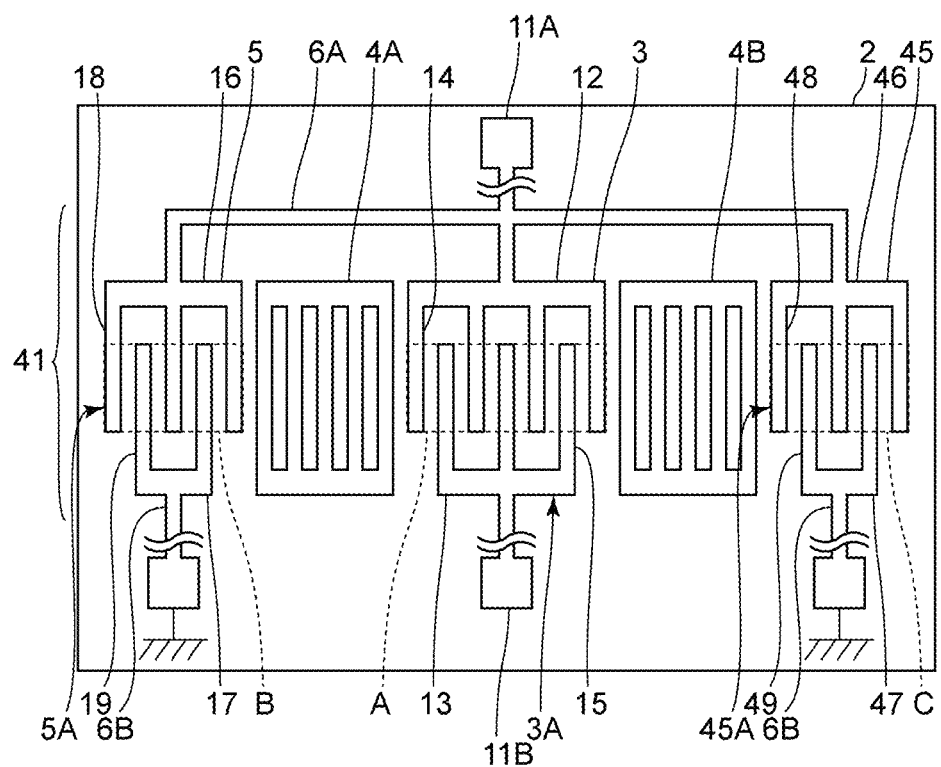
FIG. 14 is a schematic plan view illustrating an electrode structure of an acoustic wave device according to a third preferred embodiment of the present invention.

FIG. 14 is a schematic plan view illustrating an electrode structure of an acoustic wave device according to a third preferred embodiment of the present invention.

The present preferred embodiment differs from the first preferred embodiment in that the present preferred embodiment includes, in addition to the second IDT electrode 5, another second IDT electrode 45 other than the second IDT electrode 5. An acoustic wave device 41 includes the second IDT electrode 5 and the second IDT electrode 45 in a pair. Apart from the points described above, the acoustic wave device 41 according to the present preferred embodiment is the same or substantially the same as the acoustic wave device 1 according to the first preferred embodiment.

The second IDT electrode 45 is disposed on the piezoelectric substrate 2. The second IDT electrode 45 faces the first IDT electrode 3 across the reflector 4B. The piezoelectric substrate 2 and the second IDT electrode 45 define a second IDT 45A.

The second IDT electrode 45 is the same or substantially the same as the second IDT electrode 5. More specifically, the second IDT electrode 45 includes a third busbar 46 and a fourth busbar 47 in a pair, and a plurality of third electrode fingers 48 and a plurality of fourth electrode fingers 49. The second IDT electrode 45 includes a second intersecting area C. In the second intersecting area C, the third electrode fingers 48 and the fourth electrode fingers 49 overlap in the propagation direction of acoustic wave. The resonant frequency of the second IDT 45A is in the interference-wave frequency band similarly to the second IDT 5A. The design parameters of the second IDT electrode 45 are not necessarily the same as the design parameters of the second IDT electrode 5.

Both the third busbar 16 of the second IDT electrode 5 and the third busbar 46 of the second IDT electrode 45 are connected by the hot wire 6A to the first busbar 12 of the first IDT electrode 3. The fourth busbar 17 of the second IDT electrode 5 and the fourth busbar 47 of the second IDT electrode 45 are coupled to the ground potential via the ground wire 6B. The first intersecting area A of the first IDT electrode 3, the second intersecting area B of the second IDT electrode 5, and the second intersecting area C of the second IDT electrode 45 overlap in the propagation direction of acoustic wave.

In the present preferred embodiment, when a signal in the transmit band and an interference wave signal are inputted at the same time to the acoustic wave device 41, a wave of a frequency close to the interference-wave frequency is caused in not only the first IDT electrode 3 but also the second IDT electrode 5 and the second IDT electrode 45 in a pair. Furthermore, the second IDT electrode 5 and the second IDT electrode 45 in a pair are disposed individually facing the first IDT electrode 3 with the pair of reflectors 4A and 4B interposed therebetween. The first intersecting area A, the second intersecting area B, and the second intersecting area C overlap in the propagation direction of acoustic wave. As a result, the IMD signal caused in the first IDT electrode 3 and the IMD signals caused in the second IDT electrode 5 and the second IDT electrode 45 in a pair interfere with each other to cancel each other out. Accordingly, it is possible to reduce IMD similarly to the first preferred embodiment. Accordingly, when the acoustic wave device 41 is used in a filter device of, for example, a multiplexer, it is possible to reduce or prevent degradation of the receive sensitivity of another filter device coupled to a signal potential by common connection with the filter device.

The measurement of the level of IMD3 was conducted in the condition in which the second IDT electrode 5 and the second IDT electrode 45 in a pair of the acoustic wave device 41 according to the third preferred embodiment were varied with respect to the number of pairs of electrode fingers. The number of pairs of electrode fingers varied among two, five, and ten pairs. The result of the first preferred embodiment and the result of the first comparative example are also illustrated.

Figure 15:
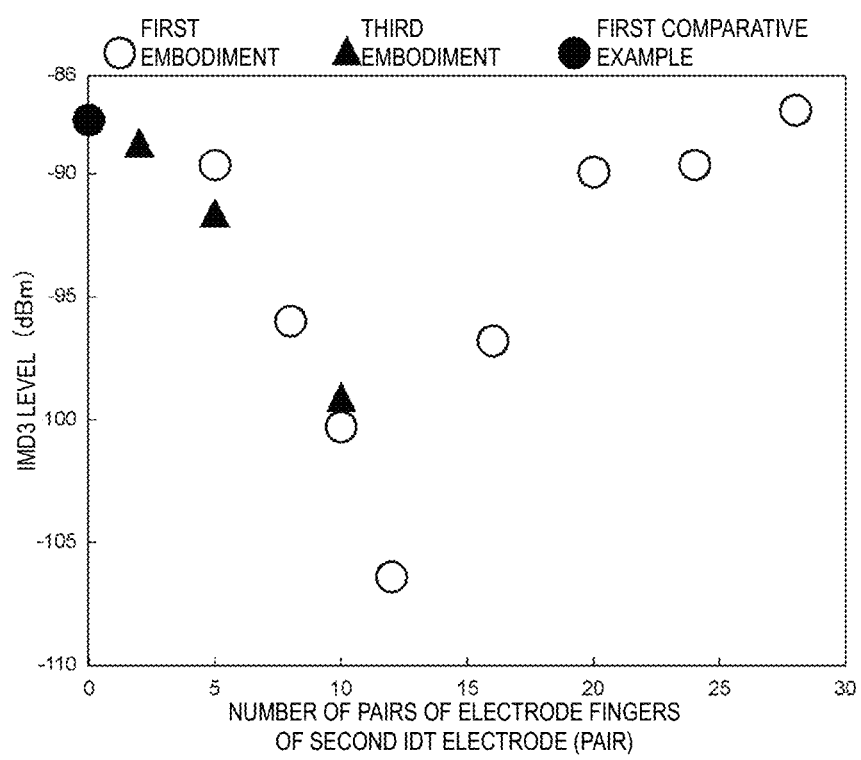
FIG. 15 illustrates the relationship between the number of pairs of electrode fingers of a second IDT electrode and the level of IMD3 with respect to the first preferred embodiment of the present invention, the third preferred embodiment of the present invention, and the first comparative example.

FIG. 15 illustrates the relationship between the number of pairs of electrode fingers of the second IDT electrode and the level of IMD3 with respect to the first preferred embodiment, the third preferred embodiment, and the first comparative example.

As illustrated in FIG. 15, regardless of the variations in the number of pairs of electrode fingers of the second IDT electrode 5 and the second IDT electrode 45 in a pair of the third preferred embodiment, IMD in the third preferred embodiment is lower than the first comparative example. In the third preferred embodiment, when the number of pairs of electrode fingers of the second IDT electrode 5 and the second IDT electrode 45 in a pair is ten or less, for example, as the number of pairs of electrode fingers increases, IMD decreases.

Figure 16:
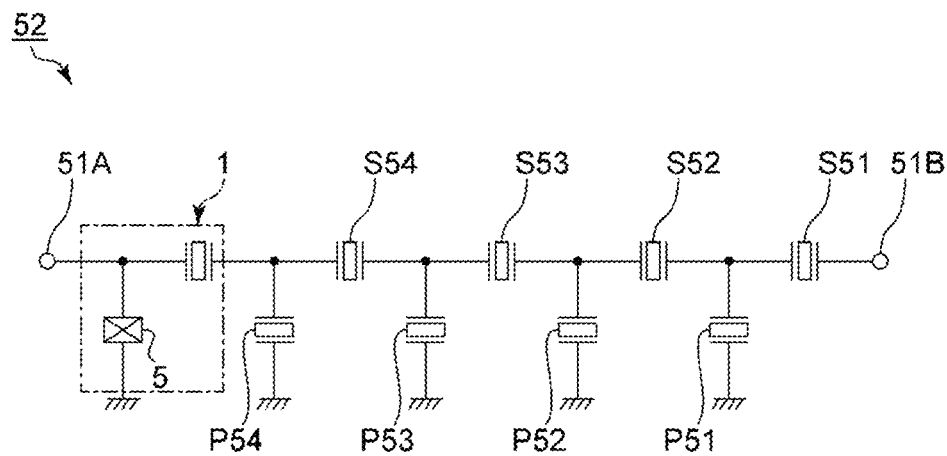
FIG. 16 is a schematic circuit diagram of a filter device according to a fourth preferred embodiment of the present invention.

FIG. 16 is a schematic circuit diagram of a filter device according to a fourth preferred embodiment of the present invention. In FIG. 16, the second IDT electrode 5 is represented by a simplified symbol of a rectangle with two diagonal lines. The first IDT electrode 3, and the reflectors 4A and 4B are represented by resonator symbols. In the present preferred embodiment, the acoustic wave device 1 serving as an acoustic wave resonator includes the first IDT electrode 3, the second IDT electrode 5, and the reflectors 4A and 4B.

The filter device 52 is a ladder filter including a plurality of series arm resonators and a plurality of parallel arm resonators. The filter device 52 is a band pass filter. The filter device 52 includes a first signal end 51A and a second signal end 51B. In the present preferred embodiment, the first signal end 51A is an antenna end coupled to an antenna. The first signal end 51A and the second signal end 51B may be provided by electrode pads or wires. In the present preferred embodiment, the first signal end 51A and the second signal end 51B are provided by electrode pads.

Between the first signal end 51A and the second signal end 51B, series arm resonators S51, S52, S53, and S54 and the acoustic wave device 1 are coupled in series with each other. In the present preferred embodiment, the acoustic wave device 1 is a series arm resonator.

A parallel arm resonator P51 is coupled between a node between the series arm resonators S51 and S52, and the ground potential. A parallel arm resonator P52 is coupled between a node between the series arm resonators S52 and S53, and the ground potential. A parallel arm resonator P53 is coupled between a node between the series arm resonators S53 and S54, and the ground potential. A parallel arm resonator P54 is coupled between a node between the series arm resonator S54 and the acoustic wave device 1, and the ground potential.

In the present preferred embodiment, each series arm resonator and each parallel arm resonator are acoustic wave resonators. In the filter device 52, a closest acoustic wave resonator of the plurality of series arm resonators and the plurality of parallel arm resonators to the first signal end 51A is the acoustic wave device 1. The first IDT electrode 3 and the second IDT electrode 5 illustrated in FIG. 2 are connected by the hot wire 6A to the first signal end 51A provided as an electrode pad. The hot wire 6A may be provided together with the first signal end 51A. The circuit configuration of the filter device 52 is not limited to the above example, and the filter device 52 only needs to include the acoustic wave device according to the present invention.

For example, the acoustic wave device 1 may be used as a parallel arm resonator in a ladder filter.

Because the filter device 52 includes the acoustic wave device 1 according to the first preferred embodiment, the filter device 52 can reduce IMD. Accordingly, when the filter device 52 is used in, for example, a multiplexer, it is possible to reduce or prevent degradation of the receive sensitivity of another filter device coupled to the signal potential on the first signal end 51A side by common connection with the filter device 52.

It is preferable that the acoustic wave device 1 is a closest resonator to the first signal end 51A. As a result, it is possible to effectively reduce or prevent degradation of the receive sensitivity of another filter device coupled to the signal potential by common connection. It should be noted that the acoustic wave device 1 is not necessarily a closest resonator to the first signal end 51A.

Figure 17:
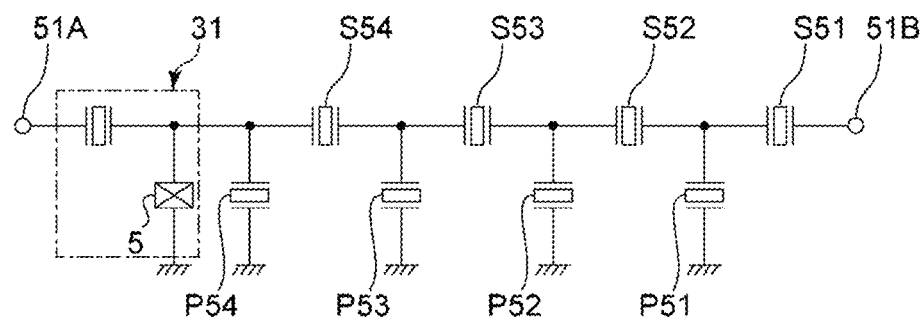
FIG. 17 is a schematic circuit diagram of a filter device according to a modification of the fourth preferred embodiment of the present invention.

FIG. 17 is a schematic circuit diagram of a filter device according to a modification of the fourth preferred embodiment.

This modification differs from the fourth preferred embodiment in that the acoustic wave device 31 of the second preferred embodiment is used as a closest resonator to the first signal end 51A. In this modification, the first IDT electrode 3 and the second IDT electrode 5 illustrated in FIG. 12 are connected by the hot wire 6A to the series arm resonator S54. The second IDT electrode 5 is also coupled to the IDT electrode of the parallel arm resonator P54. More specifically, the fourth busbar 17 of the second IDT electrode 5 is connected by a hot wire to one busbar of the pair of busbars of the IDT electrode of the parallel arm resonator P54. The first IDT electrode 3 and the second IDT electrode 5 are indirectly coupled to the signal potential on the second signal end 51B side via the series arm resonators S54, S53, S52, and S51. This modification can also reduce IMD similarly to the fourth preferred embodiment.

The fourth preferred embodiment and its modification describe an example including the acoustic wave device according to the first preferred embodiment and the acoustic wave device according to the second preferred embodiment. Also with an acoustic wave device according to another preferred embodiment of the present invention such as the third preferred embodiment, it is possible to reduce IMD similarly to the fourth preferred embodiment. The above description describes an example in which the acoustic wave device according to a preferred embodiment of the present invention is used as a series arm resonator, but the acoustic wave device according to a preferred embodiment of the present invention may be used as a parallel arm resonator.

Figure 18:
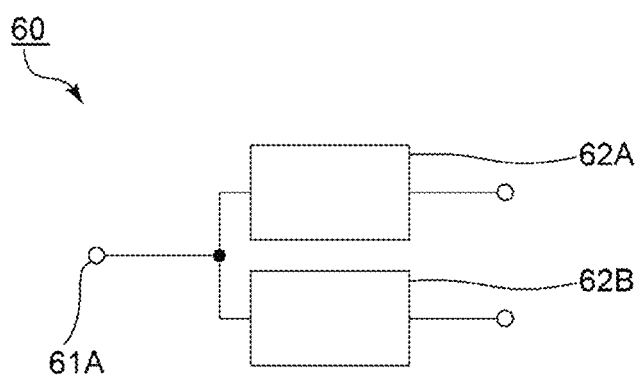
FIG. 18 is a schematic diagram of a duplexer according to a fifth preferred embodiment of the present invention.

FIG. 18 is a schematic diagram of a duplexer according to a fifth preferred embodiment of the present invention.

A duplexer 60 includes a first filter device 62A and a second filter device 62B. The first filter device 62A is a transmit filter and is also the filter device according to the fourth preferred embodiment. The second filter device 62B is a receive filter. In the duplexer 60, it is only necessary that at least the transmit filter is the filter device according to the fourth preferred embodiment.

The duplexer 60 includes a signal terminal 61A. The signal terminal 61A is an antenna terminal coupled to an antenna. The signal terminal 61A may be provided by an electrode pad or wire.

The first filter device 62A and the second filter device 62B are coupled to the signal terminal 61A by common connection. The communication band of the duplexer 60 is Band 25, for example. The pass band of the first filter device 62A is about 1850 MHz to about 1915 MHz, for example. The pass band of the second filter device 62B is about 1930 MHz to about 1995 MHz, for example. The communication band of the duplexer 60 is not limited to the example described above.

In the duplexer 60, the first filter device 62A can reduce IMD. As a result, it is possible to reduce or prevent degradation of the receive sensitivity of the second filter device 62B coupled to the signal terminal 61A by common connection with the first filter device 62A.

Figure 19:
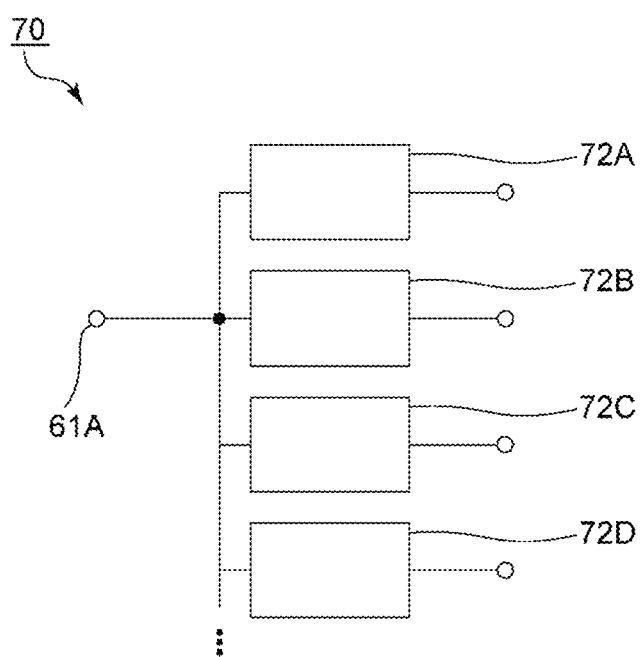
FIG. 19 is a schematic diagram of a multiplexer according to a sixth preferred embodiment of the present invention.

FIG. 19 is a schematic diagram of a multiplexer according to a sixth preferred embodiment of the present invention.

A multiplexer 70 includes a first filter device 72A, a second filter device 72B, a third filter device 72C, and a fourth filter device 72D. The first filter device 72A and the third filter device 72C are each the filter device according to the fourth preferred embodiment. The multiplexer 70 only needs to include at least one filter device implemented by the filter device according to the present invention. For example, the first filter device 72A, the second filter device 72B, the third filter device 72C, and the fourth filter device 72D may each be the filter device according to the fourth preferred embodiment.

The multiplexer 70 also includes a plurality of filter devices other than the first filter device 72A, the second filter device 72B, the third filter device 72C, and the fourth filter device 72D. The number of filter devices included in the multiplexer 70 is not limited to a particular number.

The multiplexer 70 includes the signal terminal 61A. The signal terminal 61A is an antenna terminal coupled to an antenna. The first filter device 72A, the second filter device 72B, the third filter device 72C, the fourth filter device 72D, and the other filter devices are coupled to the signal terminal 61A by common connection.

In the present preferred embodiment, the communication band of the multiplexer 70 includes Band 25 and Band 66, for example. The first filter device 72A is a transmit filter of Band 25, for example. The second filter device 72B is a receive filter of Band 25, for example. The third filter device 72C is a transmit filter of Band 66, for example. The fourth filter device 72D is a receive filter of Band 66, for example. The pass band of the first filter device 72A is about 1850 MHz to 1915 MHz, for example. The pass band of the second filter device 72B is about 1930 MHz to about 1995 MHz, for example. The pass band of the third filter device 72C is about 1710 MHz to about 1780 MHz, for example. The pass band of the fourth filter device 72D is about 2110 MHz to about 2200 MHz, for example. The communication band of the multiplexer 70 is not limited to the example described above.

As described above, the first filter device 72A and the third filter device 72C that are transmit filters of the multiplexer 70 are each implemented by the filter device according to the fourth preferred embodiment. The filter device according to the present invention may be a transmit or receive filter. The multiplexer 70 only needs to include at least one receive filter.

In known technologies, when a signal in the transmit band of Band 25 and Band 66 are being transmitted, if the antenna receives an interference wave signal, the third-order IMD is caused. As a result, the receive sensitivity in the receive band of Band 25 and Band 66 can be degraded.

In contrast, in the multiplexer 70, the first filter device 72A and the third filter device 72C can reduce IMD similarly to the fourth preferred embodiment. Consequently, it is possible to reduce or prevent degradation of the receive sensitivity of the second filter device 72B and the fourth filter device 72D.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including a piezoelectric layer;
a first interdigital transducer (IDT) electrode on the piezoelectric substrate;
a pair of reflectors on both sides of the first IDT electrode in a propagation direction of an acoustic wave on the piezoelectric substrate; and
a second IDT electrode on the piezoelectric substrate and facing the first IDT electrode with one reflector of the pair of reflectors interposed therebetween; wherein
the first IDT electrode and the second IDT electrode each include a pair of busbars and a plurality of electrode fingers, at least two electrode fingers of the plurality of electrode fingers are coupled to one busbar of the pair of busbars in each of the first IDT electrode and the second IDT electrode, and other electrode fingers of the plurality of electrode fingers are coupled to another busbar of the pair of busbars in each of the first IDT electrode and the second IDT electrode;
the first IDT electrode and the second IDT electrode each include an intersecting area in which the plurality of electrode fingers overlap in the propagation direction, and at least a portion of the intersecting area of the first IDT electrode and at least a portion of the intersecting area of the second IDT electrode overlap in the propagation direction;
one busbar of the pair of busbars of the second IDT electrode is coupled to one busbar of the pair of busbars of the first IDT electrode, and another busbar of the pair of busbars of the second IDT electrode is coupled to a ground potential; and
a resonant frequency of the second IDT electrode is in a frequency band of an interference wave signal.

2. The acoustic wave device according to claim 1, wherein
the acoustic wave device is usable in a filter device included in a duplexer or multiplexer including a transmit band and a receive band; and
a frequency of the interference wave signal is defined by 2Tx-Rx, where Tx is a frequency of the transmit band, and Rx is a frequency of the receive band.

3. The acoustic wave device according to claim 2, wherein the plurality of electrode fingers of the second IDT electrode include twenty pairs of electrode fingers or less.

4. The acoustic wave device according to claim 2, further comprising another second IDT electrode, in addition to the second IDT electrode, on the piezoelectric substrate and facing the first IDT electrode with another reflector of the pair of reflectors interposed therebetween.

5. The acoustic wave device according to claim 2, wherein
the piezoelectric substrate includes a high acoustic velocity material layer;
the piezoelectric layer is on or over the high acoustic velocity material layer with or without direct contact with the high acoustic velocity material layer; and
an acoustic velocity of a bulk wave propagating in the high acoustic velocity material layer is higher than an acoustic velocity of a bulk wave propagating in the piezoelectric layer.

6. The acoustic wave device according to claim 5, wherein
the piezoelectric substrate includes a low acoustic velocity film between the high acoustic velocity material layer and the piezoelectric layer; and
an acoustic velocity of a bulk wave propagating in the low acoustic velocity film is lower than the acoustic velocity of the bulk wave propagating in the piezoelectric layer.

7. The acoustic wave device according to claim 1, wherein the plurality of electrode fingers of the second IDT electrode include twenty pairs of electrode fingers or less.

8. The acoustic wave device according to claim 7, further comprising another second IDT electrode, in addition to the second IDT electrode, on the piezoelectric substrate and facing the first IDT electrode with another reflector of the pair of reflectors interposed therebetween.

9. The acoustic wave device according to claim 7, wherein
the piezoelectric substrate includes a high acoustic velocity material layer;
the piezoelectric layer is on or over the high acoustic velocity material layer with or without direct contact with the high acoustic velocity material layer; and
an acoustic velocity of a bulk wave propagating in the high acoustic velocity material layer is higher than an acoustic velocity of a bulk wave propagating in the piezoelectric layer.

10. The acoustic wave device according to claim 1, further comprising another second IDT electrode, in addition to the second IDT electrode, on the piezoelectric substrate and facing the first IDT electrode with another reflector of the pair of reflectors interposed therebetween.

11. The acoustic wave device according to claim 10, wherein
the piezoelectric substrate includes a high acoustic velocity material layer;
the piezoelectric layer is on or over the high acoustic velocity material layer with or without direct contact with the high acoustic velocity material layer; and
an acoustic velocity of a bulk wave propagating in the high acoustic velocity material layer is higher than an acoustic velocity of a bulk wave propagating in the piezoelectric layer.

12. The acoustic wave device according to claim 1, wherein
the piezoelectric substrate includes a high acoustic velocity material layer;
the piezoelectric layer is on or over the high acoustic velocity material layer with or without direct contact with the high acoustic velocity material layer; and
an acoustic velocity of a bulk wave propagating in the high acoustic velocity material layer is higher than an acoustic velocity of a bulk wave propagating in the piezoelectric layer.

13. The acoustic wave device according to claim 12, wherein
the piezoelectric substrate includes a low acoustic velocity film between the high acoustic velocity material layer and the piezoelectric layer; and
an acoustic velocity of a bulk wave propagating in the low acoustic velocity film is lower than the acoustic velocity of the bulk wave propagating in the piezoelectric layer.

14. The acoustic wave device according to claim 12, wherein the high acoustic velocity material layer is a high acoustic velocity support substrate.

15. The acoustic wave device according to claim 12, wherein
the piezoelectric substrate includes a support substrate, and
the high acoustic velocity material layer is a high acoustic velocity film on the support substrate.

16. The acoustic wave device according to claim 1, wherein
the acoustic wave device is capable of being coupled to an antenna;
the pair of busbars of the first IDT electrode define a first busbar and a second busbar, and the first busbar is closer to the antenna than the second busbar; and
one busbar of the pair of busbars of the second IDT electrode is coupled to a signal potential and to the first busbar.

17. The acoustic wave device according to claim 1, wherein
the acoustic wave device is capable of being coupled to an antenna;
the pair of busbars of the first IDT electrode define a first busbar and a second busbar, and the first busbar is closer to the antenna than the second busbar; and
one busbar of the pair of busbars of the second IDT electrode is coupled to a signal potential and to the second busbar.

18. A filter device configured to be coupled to an antenna, the filter device comprising:
a series arm resonator; and
a parallel arm resonator; wherein
at least one of the series arm resonator and the parallel arm resonator is the acoustic wave device according to claim 1.

19. The filter device according to claim 18, wherein a closer resonator among the series arm resonator and the parallel arm resonator to the antenna is the acoustic wave device.

20. A multiplexer comprising:
an antenna terminal to be coupled to the antenna; and
a plurality of filter devices coupled to the antenna terminal by common connection; wherein
at least one of the filter devices is the filter device according to claim 18.

* * * * *